US010985287B2

(12) United States Patent
Mwaura (10) Patent No.: US 10,985,287 B2
(45) Date of Patent: Apr. 20, 2021

(54) METHOD OF MANUFACTURING PRINTED PHOTOVOLTAIC MODULES (71) Applicant: ARMOR SOLAR POWER FILMS, Nantes (FR)

(72) Inventor: Jeremiah Mwaura, Andover, MA (US)

(73) Assignee: Armor, Nantes (FR)

( * ) Notice: Subject to any disclaimer, the term of this patent is extended or adjusted under 35 U.S.C. 154(b) by 0 days.

(21) Appl. No.: 15/459,662

(22) Filed: Mar. 15, 2017

(65) Prior Publication Data
US 2017/0271539 A1 Sep. 21, 2017

(30) Foreign Application Priority Data

Mar. 16, 2016 (EP) .................................... 16305290

(51) Int. Cl.
*H01L 31/0463* (2014.01)
*H01L 31/0465* (2014.01)
(Continued)

(52) U.S. Cl.
CPC ........ *H01L 31/0463* (2014.12); *H01L 27/301* (2013.01); *H01L 31/022466* (2013.01);
(Continued)

(58) Field of Classification Search
CPC ............ H01L 31/0465; H01L 31/0468; H01L 51/0032; H01L 31/022466; H01L 31/0463;
(Continued)

(56) References Cited

U.S. PATENT DOCUMENTS 6,150,605 A * 11/2000 Han ..................... H01G 9/2027
136/249
2005/0156176 A1 7/2005 Gupta et al.
(Continued)

FOREIGN PATENT DOCUMENTS

JP S63-194371 A 8/1988
JP 2011521416 A 7/2011
(Continued)

OTHER PUBLICATIONS

Extended European Search Report for EP Application 16305290.5 dated Sep. 15, 2016.
(Continued)

*Primary Examiner* — Lindsey A Bernier
(74) *Attorney, Agent, or Firm* — Thompson Coburn LLP; Steven M. Ritchey (57) ABSTRACT

The invention concerns a method of manufacturing a photovoltaic module comprising at least two electrically connected photovoltaic cells, each photovoltaic cell ($4_i$) being multi-layered structure disposed on a substrate (6) having down-web direction (X) and a cross-web direction (Y). The method comprises providing a plurality of spaced-apart first electrode strips ($8_i$) over the substrate (6), each first electrode strip extending along the cross-web direction (Y), and providing, over the first electrode strips layer, at least one insulating strip (14a, 14b) of an insulator material extending along the down-web direction (X), each insulating strip defining a connecting area and an active area. A functional stack (20) comprising a full web coated layer of photoactive semiconductor material is formed over the first layer and within the active area. A plurality of spaced-apart second electrode strips ($28_i$) are provided within the active area, each second electrode strip extending along the cross-web direction (Y), so as to form photovoltaic cells and a photovoltaic module is formed by electrically connecting at least (Continued)

two adjacent photovoltaic cells, by extending over the insulating strips (14a, 14b) electrical connection patterns to electrically connect, within the connecting area(s), the second electrode strip of an photovoltaic cell to the first electrode strip of an adjacent photovoltaic cell.

23 Claims, 7 Drawing Sheets

(51) Int. Cl.
*H01L 27/30* (2006.01)
*H01L 31/18* (2006.01)
*H01L 51/42* (2006.01)
*H01L 51/44* (2006.01)
*H01L 31/0224* (2006.01)
*H01L 31/05* (2014.01)

(52) U.S. Cl.
CPC ...... *H01L 31/0465* (2014.12); *H01L 31/0504* (2013.01); *H01L 31/18* (2013.01); *H01L 31/1876* (2013.01); *H01L 31/1888* (2013.01); *H01L 51/4273* (2013.01); *H01L 51/442* (2013.01); *H01L 51/445* (2013.01); *Y02E 10/549* (2013.01); *Y02P 70/50* (2015.11)

(58) Field of Classification Search
CPC . H01L 31/0504; H01L 31/18; H01L 31/1876; H01L 31/1888; H01L 51/4273; H01L 51/442; H01L 51/445; Y02E 10/50; Y02E 10/549

See application file for complete search history.

(56) References Cited

U.S. PATENT DOCUMENTS

| | | | |
|---|---|---|---|
| 2011/0308588 A1* | 12/2011 | Nishi | ............... H01L 31/03682 136/255 |
| 2014/0041712 A1 | 2/2014 | Mima et al. | |
| 2015/0372248 A1* | 12/2015 | Okada | .................. H01L 51/441 136/256 |
| 2015/0380465 A1 | 12/2015 | Huang et al. | |

FOREIGN PATENT DOCUMENTS

| | | | | |
|---|---|---|---|---|
| JP | 2012094619 A | 5/2012 | | |
| JP | 2012134188 A | 7/2012 | | |
| WO | 2013/152952 A1 | 10/2013 | | |
| WO | WO-2014122859 A1 * | 8/2014 | ........... H01L 51/441 |

OTHER PUBLICATIONS

Krebs, "Polymer Solar Cell Modules Prepared Using Roll-to-Roll Methods: Knife-Over-Edge Coating, Slot-Die Coating and Screen Printing", Solar Energy Materials & Solar Cells, 2009, pp. 465-475, vol. 93.

Japanese Office Action issued in Application No. 2017-049562, dated Feb. 1, 2021.

* cited by examiner

METHOD OF MANUFACTURING PRINTED PHOTOVOLTAIC MODULES

CROSS-REFERENCE TO RELATED APPLICATIONS

This patent application claims priority to European Patent Application 16305290.5, filed Mar. 16, 2016, the entire disclosure of which is incorporated herein by reference.

FIELD OF THE INVENTION

The present invention concerns a method of manufacturing a photovoltaic module comprising at least two electrically connected photovoltaic cells, each photovoltaic cell having a multi-layered structure deposited on a substrate having a down-web direction and a cross-web direction. The invention further concerns an associated photovoltaic module.

The invention belongs to the field of manufacturing photovoltaic modules.

BACKGROUND OF THE INVENTION

A photovoltaic cell is an electronic component which when exposed to light (photons), produces electricity by means of the photovoltaic effect which is at the origin of the phenomenon. The obtained current is related to the incident light power. The photovoltaic cell delivers a DC (direct current) voltage.

The photovoltaic effect is, for a photovoltaic cell, obtained by means of the properties of semiconductor materials.

By the expression of "semiconductor" is meant a material which has the electrical characteristics of an insulator, but for which the probability that an electron may contribute to an electric current, although small, is non-negligible. In other words, the electrical conductivity of a semiconductor is intermediate between the electrical conductivity of metals and the electrical conductivity of insulators.

The invention belongs more particularly to the field of organic photovoltaic cells and modules; such organic photovoltaic field is often designated by its acronym OPV for "organic photovoltaic."

An organic photovoltaic cell is a particular photovoltaic cell, formed as a multi-layered structure having a first electrode layer, or bottom electrode, of a first electrically conductive material, at least one active layer and a second electrode layer, or top electrode, of a second electrically conductive material, wherein the active layer is made of organic molecules or polymers forming a photoactive semiconductor material.

A semiconductor is considered as organic as soon as the semiconductor comprises at least one bond being part of the group formed by covalent bonds between a carbon atom and a hydrogen atom, covalent bonds between a carbon atom and a nitrogen atom, or further bonds between a carbon atom and an oxygen atom.

Organic semiconductor materials have a forbidden band, the width of which delimits the minimum energy to be provided to an electron for having it pass from a fundamental state to an excited state. The energy for example is provided as light energy.

A single OPV cell generates a given voltage and a given electrical current when it is exposed to light.

In order to increase the DC voltage produced with solar energy, it is known to electrically connect in series a plurality of photovoltaic cells. For example, an organic photovoltaic module is formed by electrically connecting a plurality of organic photovoltaic cells.

Manufacturing organic photovoltaic modules composed of electrically connected organic photovoltaic cells can be achieved by "roll-to-roll" (R2R) methods, as described in article "Polymer solar cell modules prepared using roll-to-roll methods: Knife-over-edge coating, slot-die coating and screen printing" published in "Solar Energy Materials and Solar Cells", April 2009. Such methods allow continuous and efficient manufacturing, since the substrate is presented as a large roll of tens or hundreds of meters wounded according to the longitudinal direction, and the coating of the layers is applied quasi-continuously on the substrate while unwinding the substrate.

The organic photovoltaic cells known as an inverted structure are formed as a multi-layered structure of five layers, on a PET (polyethyleneterephtalate) substrate having a down-web direction, or longitudinal direction, and a cross-web direction, or transversal direction. The layers are formed by patterning or coating according to the longitudinal direction to produce a plurality of substantially parallel photovoltaic cells along the longitudinal direction. The cells have a given width, and a lateral displacement is applied to electrically connect the bottom electrode layer of a cell to the top electrode layer of a following cell in the longitudinal direction.

The lateral displacement applied in order to achieve the electrical connection between photovoltaic cells is also disclosed in patent application WO 2013/152952 A1. In order to perform an electrical connection according to this method, the lateral displacement needs to be performed with great precision, which makes the manufacturing process complex.

Other methods comprised in the state of the art propose using patterning techniques such as a shadow mask to alleviate the necessity of perfect alignment. However, such methods hinder the advantage of improved process available through continuous manufacturing methods such as R2R methods.

The invention aims to remedy to the drawbacks of the prior art.

BRIEF SUMMARY OF THE INVENTION

To this end, the invention proposes, according to a first aspect, a method of manufacturing a photovoltaic module comprising at least two electrically connected photovoltaic cells, each photovoltaic cell being multi-layered structure disposed on a substrate having down-web direction and a cross-web direction.

The method comprises the following steps:
a) providing a plurality of spaced-apart first electrode strips of a first electrically conductive material over said substrate, each first electrode strip extending along the cross-web direction, forming a first layer of electrically conductive material;
b) providing, over said first layer of electrically conductive material, at least one insulating strip of an insulator material extending along the down-web direction, each insulating strip defining a connecting area and an active area;
c) providing a functional stack comprising a full web coated layer of photoactive semiconductor material, over the first layer of electrically conductive material and within the active area; and d) providing a plurality of spaced-apart second electrode strips of a second electrically conductive material over said functional stack and within the active area, each second electrode strip extending along the cross-web direction, each second electrode strip being aligned with a corresponding first electrode strip according to a predetermined alignment pattern to form a photovoltaic cell, and electrically connecting at least two adjacent photovoltaic cells, by providing electrical connection patterns extending over the insulating strips to electrically connect, within the connecting area(s), the second electrode strip of a photovoltaic cell to the first electrode strip of an adjacent photovoltaic cell.

Advantageously, the photovoltaic modules manufacturing method proposed renders the electrical connection in series of photovoltaic cells simpler, while maintaining the advantage of a continuous manufacturing process.

Advantageously, any number of photovoltaic cells can be electrically connected in series, allowing the generation of any output voltage required by an application.

The method of the invention further comprises features as indicated in the dependent claims, taken independently or according to any combination which is technically acceptable.

According to another aspect, the invention concerns a photovoltaic module comprising at least two electrically connected photovoltaic cells, each photovoltaic cell being multi-layered structure deposited on a substrate having down-web direction and a cross-web direction.

The photovoltaic module comprises:
- at least two spaced-apart first electrode strips of a first electrically conductive material over said substrate, each first electrode strip extending along the cross-web direction, forming a first layer of electrically conductive material;
- at least one insulating strip of an insulator material extending along the down-web direction over said first layer of electrically conductive material, each insulating strip defining a connecting area and an active area;
- a functional stack comprising a full web coated layer of photoactive semiconductor material, over the first layer of electrically conductive material and within the active area;
- at least two spaced-apart second electrode strips of a second electrically conductive material over said functional stack and within the active area, each second electrode strip extending along the cross-web direction, each second electrode strip being aligned with a corresponding first electrode strip according to a predetermined alignment pattern to form a photovoltaic cell ($4_i$); and
- electrical connection patterns extending over the insulating strips to electrically connect, within the connecting area(s), the second electrode strip of a photovoltaic cell to the first electrode strip of an adjacent photovoltaic cell.

According to an embodiment, each first electrode strip is transparent to the optical waves of wavelength in the visible spectrum.

According to an embodiment, each second electrode strip is transparent to the optical waves of wavelength in the visible spectrum.

The invention advantageously applies to the manufacturing of organic photovoltaic modules comprising at least two electrically connected organic photovoltaic cells.

BRIEF DESCRIPTION OF THE DRAWINGS

The invention will be better understood in the light of the detailed description and accompanying drawings listed below, which are only exemplary and by no way limiting.

DETAILED DESCRIPTION OF THE INVENTION

The invention is described hereafter in its application to the manufacturing of organic photovoltaic modules.

According to an embodiment of the invention, illustrated in FIGS. 1 and 3 to 7, an organic photovoltaic module 2 is composed of a plurality of organic photovoltaic cells $4_i$.

Each organic photovoltaic cell 4 is formed by layers on a substrate 6 which is a flexible sheet preferably made of PET-type material (polyethylene terephthalate), or PEN-type material (polyethylene naphthalate), metal foil, or flexible glass.

The manufacturing process of organic photovoltaic modules is a continuous process, known as roll-to-roll process, wherein the subsequent layers forming the organic photovoltaic cells are deposited by coating or printing on a substrate roll.

We consider a down-web or longitudinal direction of the substrate 6, referenced as X direction, and a cross-web or transversal direction of the substrate, referenced as Y.

The substrate 6 has a first external border 6a and a second external border 6b in the down-web direction X.

The multiple layers forming the organic photovoltaic cells are deposited on the substrate according to a stacking direction, referenced as Z direction.

Figure 1:
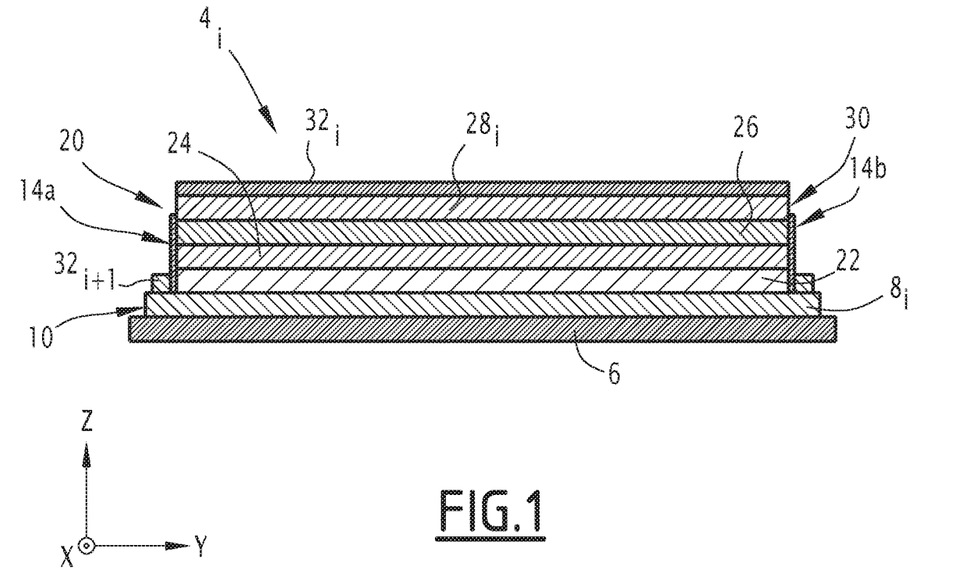
FIG. 1 represents schematically a transversal cut of an organic photovoltaic cell according to an embodiment.

FIG. 1 is a schematic representation of an organic photovoltaic cell $4_i$ in the (Y,Z) plane, whereas FIGS. 3 to 7 represent the various successive layers in the (X,Y) plane.

The flexible substrate 6 has a given width W and a thickness z preferably comprised between 50 μm and 500 μm, and preferably of 125 μm.

Figure 2:
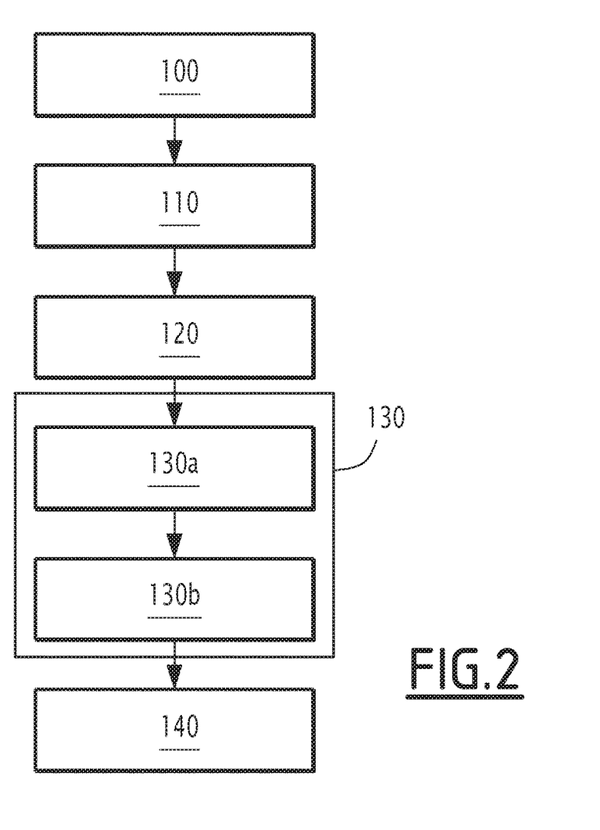
FIG. 2 is a flowchart of the main steps of a manufacturing method according to an embodiment.

FIG. 2 is a flowchart of the main steps of a manufacturing process applied according to an embodiment of the invention.

A first step 100 of the manufacturing process consists in providing a plurality of N spaced-apart first electrode strips of a first electrically conductive material over the substrate 6, each first electrode strip $8_i$ extending along the cross-web direction, forming a first layer 10 of electrically conductive material.

A plurality of N=8 first electrode strips $8_1, 8_2 \ldots 8_{i+1}$ are illustrated in FIGS. 3 to 7. It is understood that any number N of first electrode strips $8_n$ may be provided.

The first electrode strips $8_i$ are sensibly parallel according to the cross-web direction Y, and two adjacent first electrode strips $8_i$ and $8_{i+1}$ are spaced-apart by a row of width r, preferably comprised between 100 μm and 1000 μm.

Therefore, the first electrode strips are disposited on the substrate 6 according to a first predetermined alignment or registration pattern.

Each first electrode strip $8_i$ has a length $y_B$ equal or slightly smaller than the width W of the substrate 6, a width $x_B$ preferably comprised between 5 mm to 15 mm and a thickness $z_B$.

The first electrode strips $8_i$ are made of a first electrically conductive material.

Examples of suitable electrically conductive materials include electrically conductive metals, electrically conductive alloys, electrically conductive polymers, and electrically conductive metal oxides.

Examples of electrically conductive metals include gold, silver, copper, aluminum, nickel, palladium, platinum, and titanium.

Examples of electrically conductive alloys include stainless steel (e.g., stainless steel, stainless steel), alloys of gold, alloys of silver, alloys of copper, alloys of aluminum, alloys of nickel, alloys of palladium, alloys of platinum and alloys of titanium.

Examples of electrically conducting polymers include polythiophenes (e.g., doped poly(3,4-ethylenedioxythiophene) (doped PEDOT)), polyanilines (e.g., doped polyanilines), polypyrroles (e.g., doped polypyrroles).

Examples of electrically conducting metal oxides include indium tin oxide (ITO), fluorinated tin oxide, tin oxide and zinc oxide.

In some embodiments, the electrically conductive metal oxides described above can be doped. In some embodiments, the first electrically conductive material can include a multilayer material, such as an ITO/metal/ITO material or a dielectric/metal/dielectric material. In some embodiments, a combination of the materials described above can be used.

Preferably, the first electrically conductive material is transparent to the optical waves of wavelength in the visible spectrum.

Preferably, the first electrode strips $8_i$ are applied on the substrate 6 by wet processes including flexographic printing, rotary screen printing, inkjet printing.

Figure 3:
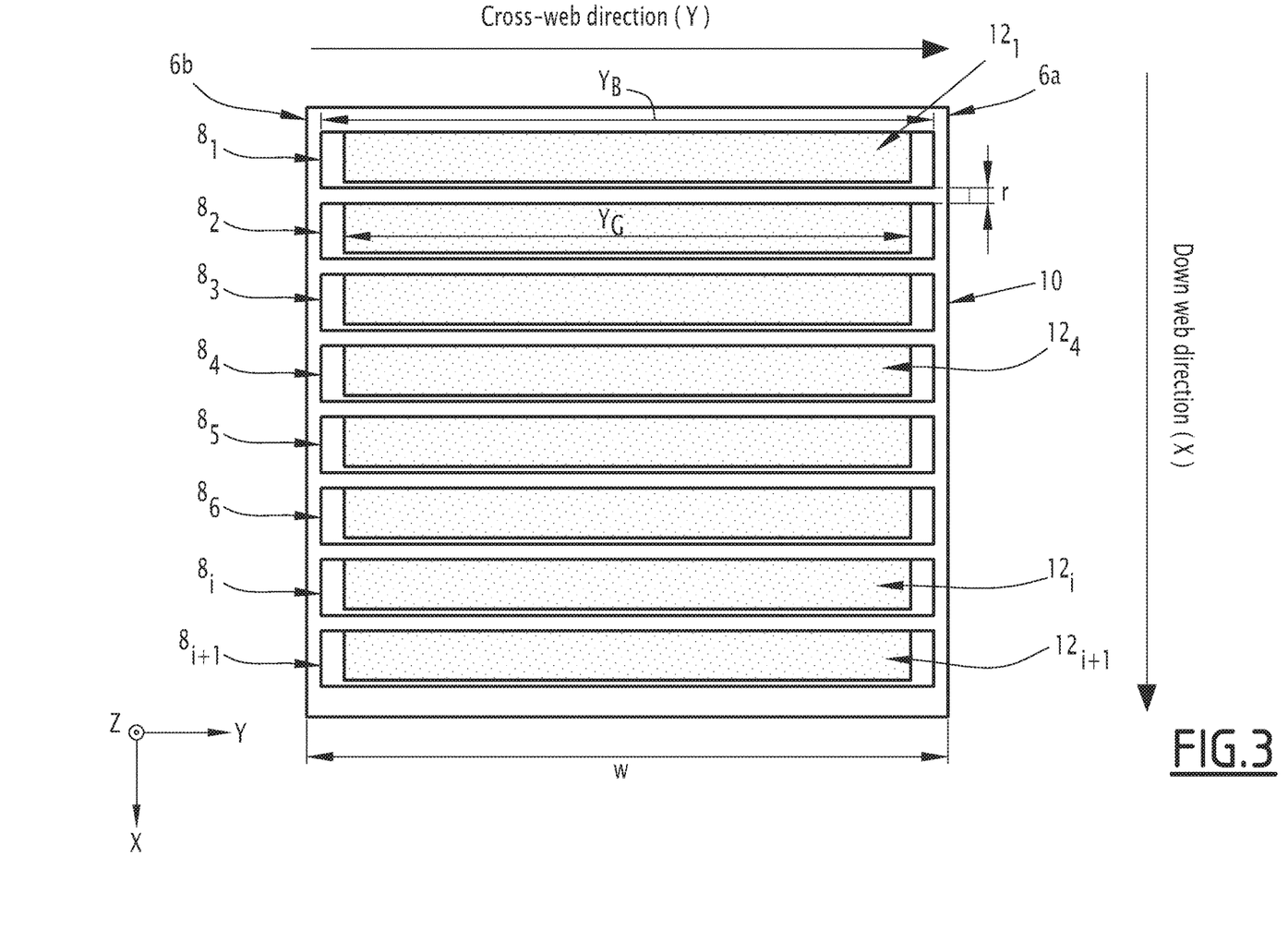
FIGS. 3 to 7 are top views of intermediate results of the manufacturing process of FIG. 2.

In the embodiment illustrated in FIG. 3, each first strip electrode $8_i$ is coated or printed with a grid portion $12_i$. Each grid portion $12_i$ has a length $y_G$, smaller than the length $y_B$ of the first electrode strip $8i$, and a width $x_G$, smaller than the width $x_{13}$ of the first electrode strip $8_i$.

The length $y_G$ of each grid portion is smaller than or equal to the width $W_1$ of an active area 18 as described in detail hereafter.

Advantageously, the grid portions $12_i$ improve transparency of the cells and modules. Transparency is a valuable property for integration of modules in end-user applications.

Step 100 of providing a plurality of spaced-apart first electrode strips is followed by step 110 of providing, over the first layer 10 of electrically conductive material, insulating strips 14a, 14b, which are deposited or printed along the down-web direction
X, over portions of the first electrode strips $8_i$.

Figure 4:
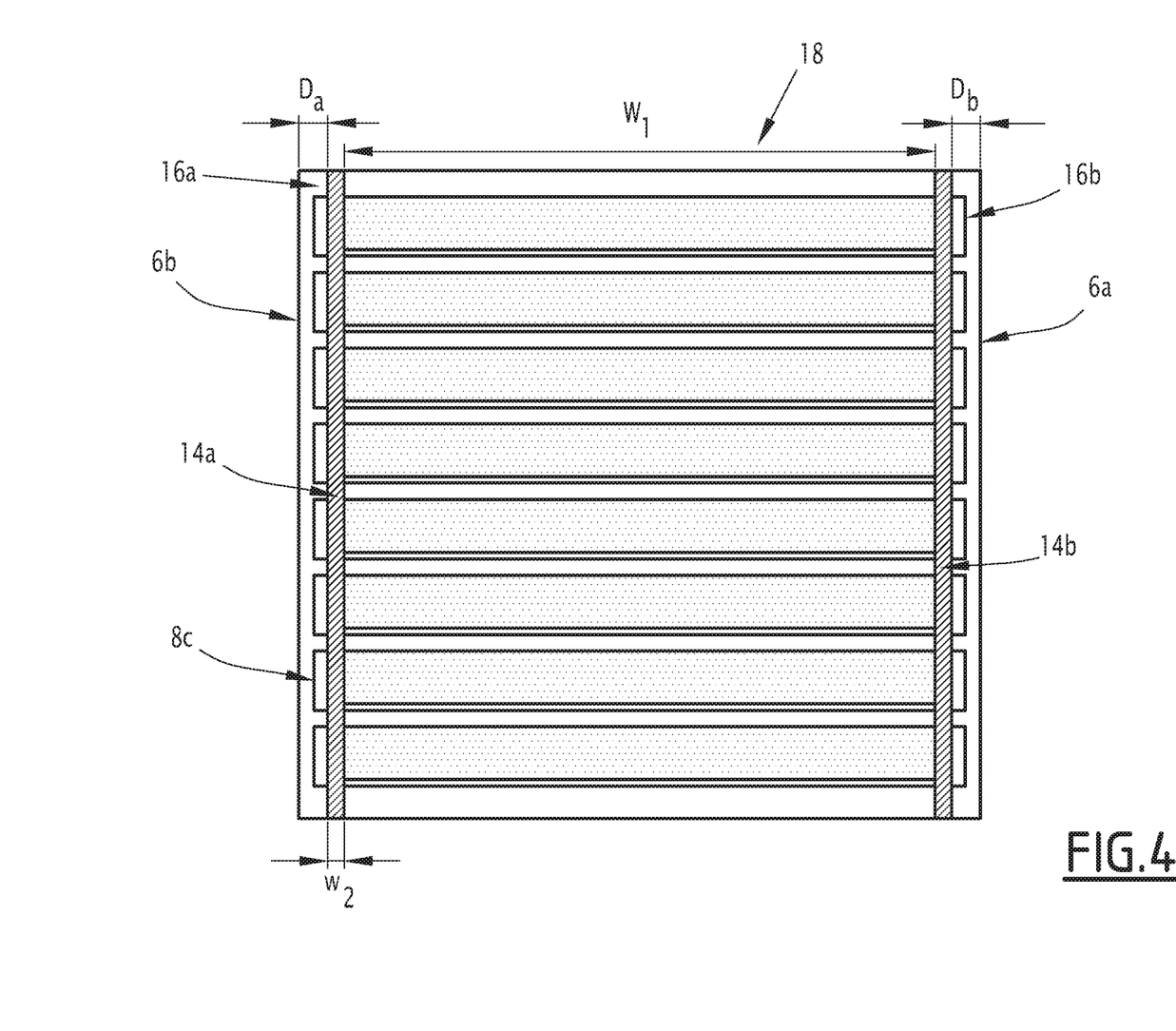

In an embodiment, the insulating strips 14a, 14b are deposited continuously over the first layer 10, as shown schematically on FIG. 4.

One or several additional couple(s) of insulating strips could be coated in the middle area of the substrate in order to define two parallel sets of series-connected cells creating two different modules with smaller width which could be coated simultaneously.

Each insulating strip 14a, 14b extends along the longitudinal direction, and has a width $W_2$ along de cross-web Y direction comprised between 0.5 mm and 1.5 mm, and preferably equal to 1 mm, and a thickness $z_3$ comprised between 10 µm and 25 µm.

Each insulating strip is deposited sensibly parallel to a corresponding external border 6a, 6b of the substrate 6, at a given distance $D_a$, $D_b$ to the external border.

Preferably the distances $D_a$, $D_b$ are 10 mm on each side.

Each insulating strip 14a, 14b defines a border between an external connecting area 16a, 16b, comprising a plurality of plain first electrically conductive material portions of the first electrode strips, and an active area 18.

The active area 18 has a dimension $W_1$ along the Y direction, which is the cross-web direction, also referred to as active area width.

Each connecting area 16a, 16b, has a dimension along the cross-web direction, also referred to as connecting area width, respectively equal to $D_a$, $D_b$.

Each connecting area width $D_a$, $D_b$ is chosen so that the connecting area comprises plain first electrically conductive material portions of the first electrode strips which allow forming electric connections, as explained hereafter.

The insulating strips 14a, 14b are applied by wet processes including slot-die coating, flexographic printing, screen printing, inkjet printing.

In one embodiment, the insulating strips are made of an insulating material such as polymers prepared from monomeric materials such as amines, acrylates, epoxies, urethanes, or combinations thereof.

These monomeric materials can be either coated on a substrate from a solvent or coated on a substrate directly without using a solvent when they are in the form of a liquid at room temperature.

The monomeric materials (e.g., amines and epoxides) can be mixed, coated on a substrate, and thermally treated to produce transparent or translucent polymers as an insulator.

Figure 5:
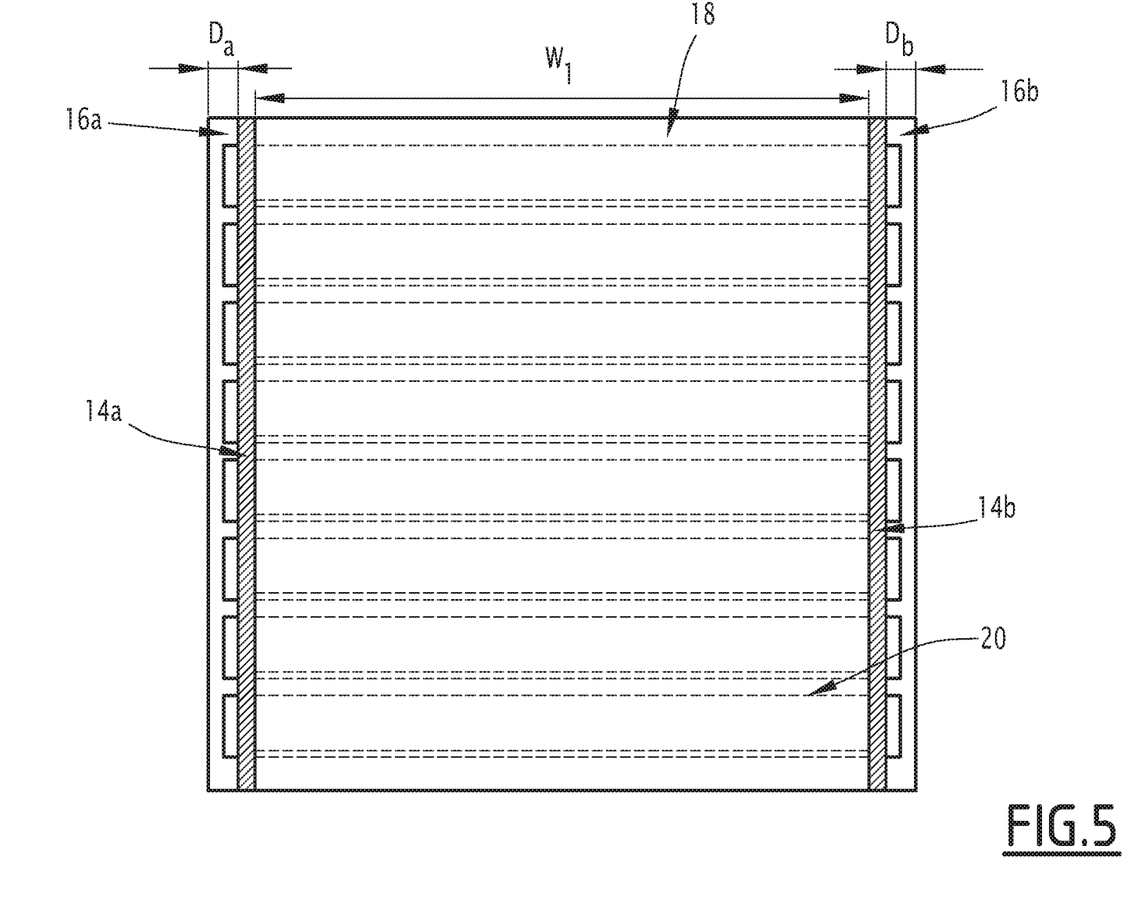

Step 110 of providing insulating strips 14a, 14b, is followed by step 120 of providing one or several full web coated layers in the active area 18, forming a functional stack 20, the result of which is schematically illustrated in FIGS. 1 and 5.

In an embodiment, the functional stack 20 is constituted as a superposition of three layers which comprises a first intermediate layer 22 which is provided within the active area 18, a photoactive layer 24 provided onto the first intermediate layer 22 and within the active area 18, and a second intermediate layer 26 provided onto the photoactive layer 24 and within the active area 18.

In an alternative embodiment, the functional stack 20 is constituted as a single photoactive layer 24.

The photoactive layer 24 is a full web coated layer of photoactive semiconductor material, deposited or printed within the active area.

The photoactive semiconductor material is constituted of a mixture of an electron donor material (also called n-type material) and an acceptor of electrons material (also called type p material). These semiconductor materials can be a molecule, an oligomer or a conjugated organic polymer. Thus the photoactive layer 24 may be a heterojunction with an electron donor material and an electron acceptor material.

The photoactive layer can include an organic electron donor material and an organic electron acceptor material. Suitable organic electron donor materials include conjugated polymers, such as polythiophenes (e.g., poly(3-hexylthiophene) (P3HT)) or poly(phenylene-vinylene)s (PPVs), small molecules, such as of DTS-(FBTTH2)2, IBTP, IDF, DTS-(PTTH2), borodipyromethene, diketopyrrolopyrrole, oligothiophene, indigo, quinacridone, merocyanin, squarain.

Suitable organic electron acceptor materials include fullerenes (e.g., a substituted fullerene such as [6,6]-phenyl C61-butyric acid methyl ester (C61-PCBM) and [6,6]-phenyl C71-butyric acid methyl ester (C71-PCBM)).

Alternatively the photoactive layer 24 can be constituted of an organic/inorganic hybrid material such as perovskite material.

The first intermediate layer 22 and the second intermediate layer 26 form interface layers, made of semiconductor materials of type p or type n, suited to perform transportation or injection of electrons or holes, chosen in accordance with the semiconductor material of the photative layer 24.

For example, the first intermediate layer 22 and the second intermediate layer 26 are made of semiconductor materials.

The first intermediate layer 22, the photoactive layer 24 and the second intermediate layer 26 are respectively applied by wet processes including slot-die coating, flexographic printing, screen printing, ink-jet printing.

In an embodiment, the first intermediate layer 22 is an electrically conductive layer applied by wet processes onto the first conductive layer 10 made of semiconductor materials, including Zinc Oxide (ZnO), Titanium Oxides (TiOx), cesium carbonate $Cs_2CO_3$, PolyEthylenlmine (PEI).

In an embodiment, the second intermediate layer 26 is a hole transport layer, applied by wet processes onto the photoactive layer 24 made of semiconductor materials, including poly(3,4-ethylenedioxythiophene) polystyrene sulfonate (PEDOT:PSS), Molybdenum trioxide ($MoO_3$), tungsten trioxide ($WO_3$).

Figure 6:
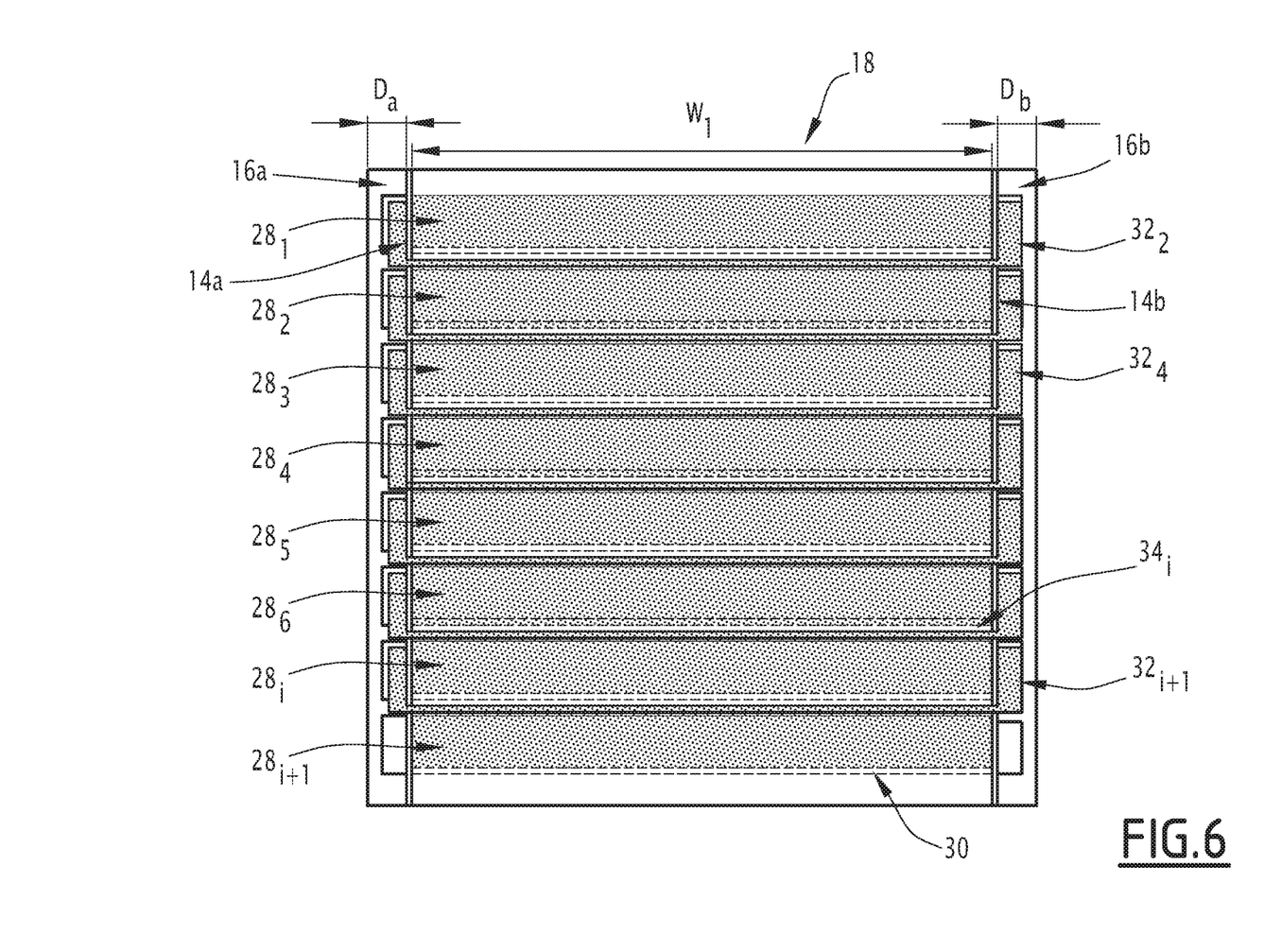

Step 120 of providing a functional stack 20 within the active area 18 is followed by step 130a of providing second electrode layer 30 composed of a plurality of N spaced-apart second electrode strips $28_i$ of a second electrically conductive material over the functional stack 20 and within the active area 18, as illustrated in FIGS. 1 and 6.

The plurality of second electrode strips form a second electrically conductive layer 30.

Each second electrode strip $28_i$ is extending along the cross-web direction and is aligned with a corresponding first electrode strip according to a second predetermined alignment pattern, so as to form an organic photovoltaic cell $4_i$.

A plurality of N=8 second electrode strips $28_1, 28_2, \ldots, 28_{i+1}$ are illustrated in FIG. 6.

The second electrode strips $28_i$ are made of second electrically conductive material.

Examples of suitable electrically conductive materials include electrically conductive metals, electrically conductive alloys, electrically conductive polymers, and electrically conductive metal oxides, as already described for the first electrically conductive material.

In an embodiment, the second electrically conductive material used is the same as the first electrically conductive material used.

Preferably, the second electrically conductive material is transparent to the optical waves of wavelength in the visible spectrum.

Preferably, the second electrode strips $28_i$ are applied on the second intermediate layer 26 by wet processes including flexographic printing, rotary screen printing, inkjet printing.

Each organic photovoltaic cell $4_i$ is composed of a stack of a first electrode strip $8_i$, optionally grid coated with a grid portion $12_i$ within the active area 18, a functional stack 20 within the active area 18, the functional stack being, in one embodiment, formed by a superposition of semiconductor layers including a photoactive layer, and a second electrode strip $28_i$ aligned with the first electrode strip according to the second predetermined alignment pattern made by registration process.

Each second electrode strip has a length $y_T$, along the Y direction, a width $x_T$ along the X direction, and a thickness $z_T$.

The length $y_T$ is equal to or smaller than the width $W_1$ of the active area, and the width $x_T$ is equal to or smaller than the width $x_B$ of the first electrode strips.

The second alignment pattern is such that the second electrode strip $28_i$ is positioned on top of the corresponding first electrode strip $8_i$, the borders along the Y direction of the second electrode strips being sensibly parallel to the borders along the Y direction of the first electrode strips, with a position offset $Off_i$ along the X direction between the second electrode strip $28_i$ and the corresponding first electrode strip comprised between 100 µm and 1000 µm.

Step 130a of providing a plurality of N spaced-apart second electrode strips $28_i$ is followed by step 130b of forming series connection patterns for electrically connecting adjacent organic photovoltaic cells $4_i$, $4_{i+1}$, by connecting the second electrode strip $28_i$ of the organic photovoltaic cell $4_i$ with the first electrode strip $8_{i+1}$ of the organic photovoltaic cell $4_{i+1}$ within the connecting areas 16a, 16b.

Figure 7:
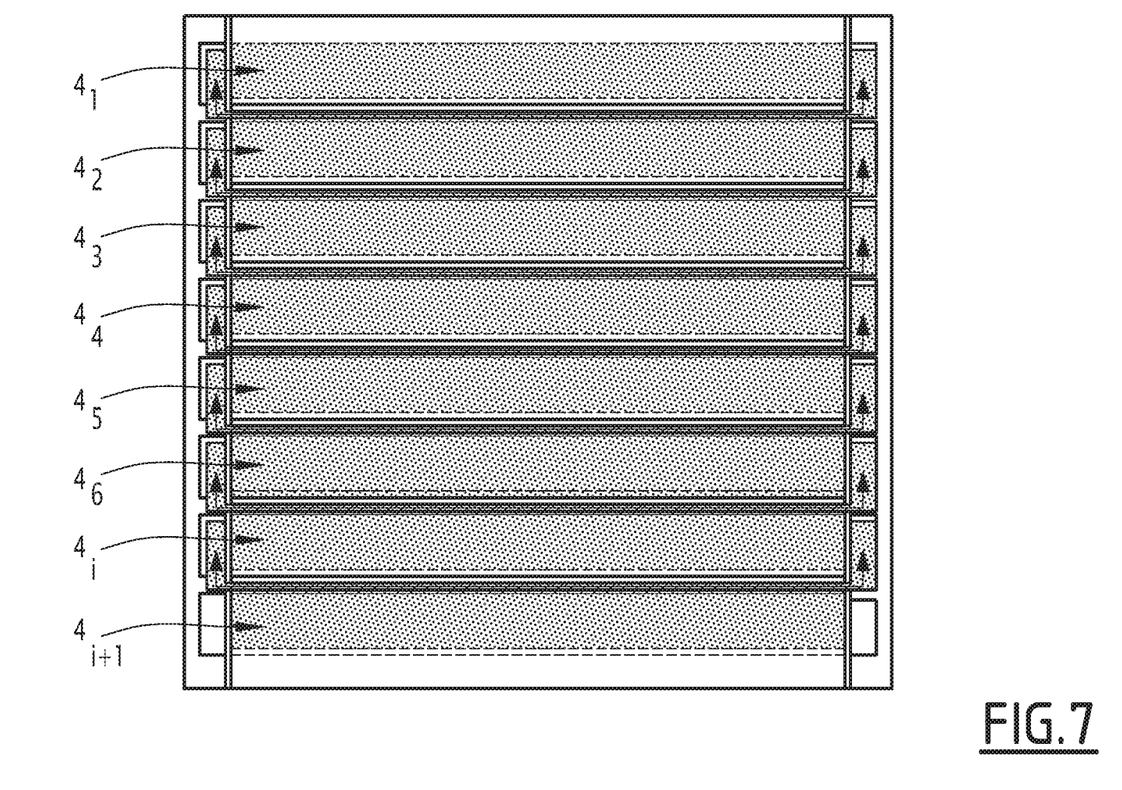

Such electrical connection patterns $32_1, \ldots, 32_i$ are schematically shown in FIGS. 1, 6 and 7.

The electrical connection patterns $32_i$ extend over the insulating strips 14a, 14b.

In the embodiment illustrated, the electrical connection patterns have a general "U-shape" as seen in FIGS. 6 and 7, for connecting a second electrode strip $28_i$ to connecting areas 16a, 16b of an adjacent first electrode strip $8_{i+1}$.

It is understood that alternatively, the electrical connection may be achieved between the first electrode strip $8_i$ of the organic photovoltaic cell $4_i$ and the second electrode strip $28_{i+1}$ of the organic photovoltaic cell $4_{i+1}$.

The electrical connection patterns $32_i$ are provided in such a way that the electrical conductive material applied onto a second electrode strip $28_i$ of organic photovoltaic cell $4_i$ is only in contact with the first electrode strip of an adjacent organic photovoltaic cell $4_{i+1}$ within the connecting area 16a, 16b, but not with any other parts of said cell $4_{i+1}$.

Preferably the steps 130a and 130b are achieved in one single step 130 by printing and patterning a single layer acting as second electrode and electrical connections with the same electrically conductive material.

Preferably, second electrode strips $28_i$ and electrical connections $32_i$ are formed as a same layer and are applied on the second intermediate layer 26 by wet processes including flexographic printing, rotary screen printing, inkjet printing.

In an embodiment, the second electrode layer 30 is composed of a full web coated layer of high conducting material (<100 ohm/sq) such as PEDOT or silver nanowire, applied onto the functional stack (20) within the active area 18, together with spaced-apart strips of metal grid which are applied on top of the full web coated layer of high conducting material. For example, the spaced-apart strips of metal grid are made of silver (Ag).

The full web coated layer of high conducting material is treated within the active area 18 to form a corresponding isolating line $34_i$ between adjacent cells, so that this line $34_i$ separates the organic photovoltaic cells $4_i$ and $4_{i+1}$ and improves both the open circuit voltage ($V_{oc}$) and fill factor (FF).

Preferably, the forming of isolating lines $34_i$ is achieved by laser ablation or mechanical scribing.

In an embodiment, the second intermediate layer 26 is a hole transport layer and the treatment is applied in the second intermediate layer 26 to further isolate neighboring cells.

FIG. 7 schematically illustrates the electrical current connecting two adjacent organic photovoltaic cells.

The organic photovoltaic cells are electrically connected in series.

In an embodiment, forming series connections for electrically connecting adjacent organic photovoltaic cells is followed by a step 140 of forming photovoltaic modules, each photovoltaic module comprising a number P of electrically connected cells.

Advantageously, any number P of cells to form an organic photovoltaic module can be chosen, a module being formed by cutting the coated roll into modules with the chosen number of cells, so that the output voltage can be customized.

Advantageously, the method proposed is adapted for large-scale manufacturing processes such as R2R processes.

Figure 8:
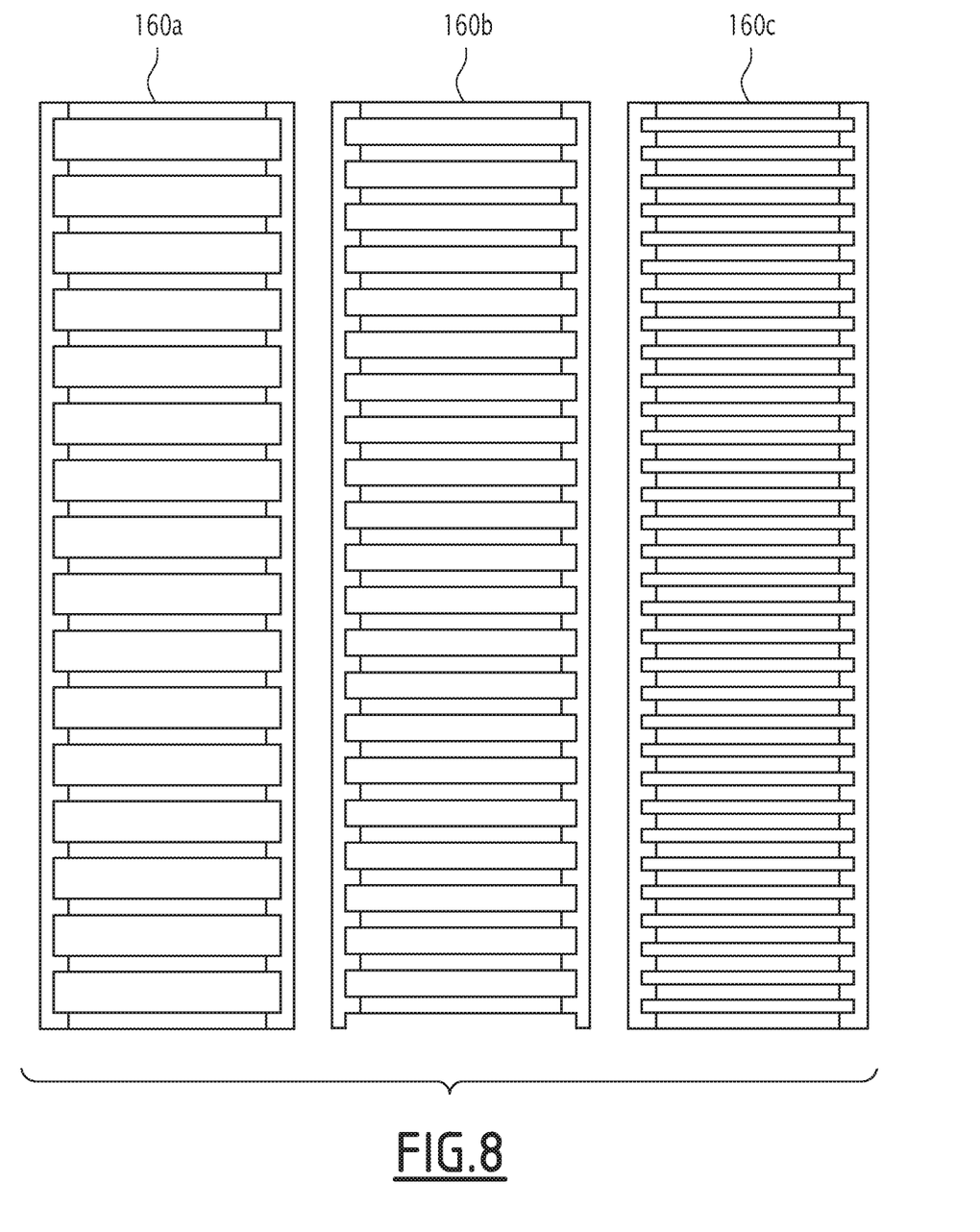
FIG. 8 illustrates several layouts of organic photovoltaic modules according to the invention.

FIG. 8 illustrates schematically several architectures or layouts 160a, 160b, 160c, each layout having organic photovoltaic cells of different width along the down-web X direction, for producing organic photovoltaic modules with different voltage per meter characteristics.

The voltage is increased by increasing the number of series connected organic photovoltaic cells forming the module, or, in other terms, by increasing the length of the module or by modulating the width of the cells and the number of cells forming the module on a same length. The current can be increased by increasing the width $W_1$ of the active area 18 thus the length $y_G$ of each organic photovoltaic cell.

Advantageously, the method proposed allows higher voltage and decreased power loss.

The manufacturing method of the invention has been described above in its particular application to manufacturing organic photovoltaic modules. The method is however not limited to this embodiment. In particular, the method applies straightforwardly within the industrial roll-to-roll printing methods of non-organic photovoltaic modules, such as for example using copper indium gallium serenade (CIGS) or copper zinc tin sulfide (CZTS) layers.

The invention claimed is:

1. A method of manufacturing a photovoltaic module comprising at least two electrically connected photovoltaic cells, each photovoltaic cell being a multi-layered structure disposed on a web substrate having a down-web direction extending along a longitudinal direction of the web substrate and a cross-web direction extending along a transversal direction of the web substrate, the down-web direction being perpendicular to the cross-web direction, the method comprising the following steps:
   a) providing at least two spaced-apart first electrode strips of a first electrically conductive material over said web substrate, each first electrode strip extending along the cross-web direction, forming a first layer of electrically conductive material;
   b) providing at least one insulating strip of an insulator material, wherein each insulating strip extends continuously and linearly along the down-web direction parallel to an external down-web border of the substrate over said first layer of electrically conductive material and over every first electrode of the first layer of electrically conductive material, and wherein each insulating strip defines a border between a connecting area and an active area;
   c) providing a functional stack comprising a full web coated layer of photoactive semiconductor material, over the first layer of electrically conductive material and within the active area; and
   d) providing at least two spaced-apart second electrode strips of a second electrically conductive material over said functional stack and within the active area, each second electrode strip extending along the cross-web direction, each second electrode strip being aligned with a corresponding first electrode strip according to a predetermined alignment pattern to form a photovoltaic cell, and providing electrical connection patterns extending over the at least one insulating strip to electrically connect, within the connecting area, the second electrode strip of a photovoltaic cell to the first electrode strip of an adjacent photovoltaic cell;

thereby manufacturing the photovoltaic module comprising the at least two electrically connected photovoltaic cells.

2. The method according to claim 1, wherein step c) further comprises:
   providing a first intermediate layer of first semiconductor material, wherein said first intermediate layer is over the first layer of electrically conductive material under the full web coated layer of photoactive semiconductor material, and within the active area;
   providing a second intermediate layer of second semiconductor material, wherein said second intermediate layer is over said full web coated layer of photoactive semiconductor material and within the active area.

3. The method according to claim 2, wherein the first intermediate layer is an electron transport layer applied onto the first layer of electrically conductive material.

4. The method according to claim 2, wherein the second intermediate layer is a hole transport layer applied by onto the full web coated layer of photoactive semiconductor material.

5. The method according to claim 2, wherein the full web coated layer of photoactive semiconductor material is applied onto the first intermediate layer.

6. The method of claim 1, wherein the at least two spaced-apart first electrode strips are applied by a wet process selected from the group consisting of flexographic printing, rotary screen printing, and inkjet printing.

7. The method according to claim 1, wherein each first electrode strip is transparent to the optical waves of wavelength in the visible spectrum.

8. The method according to claim 1, wherein the at least one insulating strip comprises two insulating strips, forming two border connecting areas and a central active area.

9. The method according to claim 1, wherein the at least one insulating strip is deposited by a wet processes selected from the group consisting of slot-die coating, flexographic printing, screen printing, and inkjet printing.

10. The method according to claim 1, wherein the at least two spaced-apart second electrode strips and the electrical connection patterns are provided by printing and patterning a single layer of the second electrically conductive material.

11. The method according to claim 1, wherein the at least two spaced-apart second electrode strips of the second electrically conductive material over said functional stack and within the active area are provided in step d) by applying a full web coated layer of the second electrically conductive material onto the active area, and applying spaced-apart strips of metal on the full web coated layer of the second electrically conductive material.

12. The method according to claim 4, wherein the at least two spaced-apart second electrode strips of the second electrically conductive material over said functional stack and within the active area are provided in step d) by applying a full web coated layer of the second electrically conductive material onto the active area, and applying spaced-apart strips of metal on the full web coated layer of the second electrically conductive material, and wherein step d) further comprises forming isolating lines by laser ablation or mechanical scribing through the full web coated layer of the second electrically conductive material and through the second intermediate layer.

13. A photovoltaic module comprising at least two electrically connected photovoltaic cells, each photovoltaic cell being a multi-layered structure disposed on a web substrate having a down-web direction extending along a longitudinal direction of the web substrate and a cross-web direction extending along a transversal direction of the web substrate, the down-web direction being perpendicular to the cross-web direction, the photovoltaic module comprising:
- at least two spaced-apart first electrode strips of a first electrically conductive material over said web substrate, each first electrode strip extending along the cross-web direction, forming a first layer of electrically conductive material;
- at least one insulating strip of an insulator material, wherein each insulating strip extends continuously and linearly along the down-web direction parallel to an external down-web border of the substrate over said first layer of electrically conductive material and over every first electrode of the first layer of electrically conductive material, and wherein each insulating strip defines a border between a connecting area and an active area;
- a functional stack comprising a full web coated layer of photoactive semiconductor material, over the first layer of electrically conductive material and within the active area;
- at least two spaced-apart second electrode strips of a second electrically conductive material over said functional stack and within the active area, each second electrode strip extending along the cross-web direction, each second electrode strip being aligned with a corresponding first electrode strip according to a predetermined alignment pattern to form a photovoltaic cell; and
- electrical connection patterns extending over the at least one insulating strip to electrically connect, within the connecting area, the second electrode strip of a photovoltaic cell to the first electrode strip of an adjacent photovoltaic cell.

14. The photovoltaic module according to claim 13, wherein each first electrode strip is transparent to the optical waves of wavelength in the visible spectrum.

15. The photovoltaic module according to claim 13, wherein each second electrode strip is transparent to the optical waves of wavelength in the visible spectrum.

16. The photovoltaic module according to claim 13, wherein each insulating strip is deposited on top of the first layer of the conductive material, parallel to a corresponding external down-web border of the web substrate, at a predetermined distance from the corresponding external down-web border.

17. The photovoltaic module according to claim 16, wherein the at least one insulating strip comprises two insulating strips, forming two border connecting areas and a central active area.

18. The photovoltaic module according to claim 13, wherein each insulating strip has a width, along the cross-web direction, of between 0.5 mm and 1.5 mm.

19. The photovoltaic module according to claim 13, wherein the functional stack further comprises:
- a first intermediate layer of first semiconductor material wherein said first intermediate layer is over the first layer of electrically conductive material under the full web coated layer of photoactive semiconductor material, and within the active area; and
- a second intermediate layer of second semiconductor material wherein said second intermediate layer is over said full web coated layer of photoactive semiconductor material and within the active area.

20. The photovoltaic module according to claim 19, wherein the first intermediate layer is an electron transport layer applied onto the first layer of electrically conductive material.

21. The photovoltaic module according to claim 19 wherein the second intermediate layer is a hole transport layer applied onto the full web coated layer of photoactive semiconductor material.

22. The photovoltaic module according to claim 13, wherein each second electrode strip has a length along the cross-web direction and a width along the down-web direction, the length of each second electrode strip being equal to or smaller than the width of the active area.

23. The photovoltaic module according to claim 22, wherein each first electrode strip has a length along the cross-web direction and a width along the down-web direction, the width of each second electrode strip being equal to or smaller than the width of each first electrode strip.

* * * * *